United States Patent [19]
Heinks et al.

[11] Patent Number: 5,140,496

[45] Date of Patent: Aug. 18, 1992

[54] DIRECT MICROCIRCUIT DECOUPLING

[75] Inventors: Michael W. Heinks, Maple Grove; Thomas J. Dunaway, St. Louis Park; Richard Spielberger, Maple Grove, all of Minn.

[73] Assignee: Honeywell, Inc., Minneapolis, Minn.

[21] Appl. No.: 636,837

[22] Filed: Jan. 2, 1991

[51] Int. Cl.⁵ .................. H01L 23/02; H05K 7/20
[52] U.S. Cl. ........................ 361/306; 357/74; 361/388
[58] Field of Search ............ 361/306, 403–408, 361/306, 321, 386, 388; 357/70, 74; 174/52 FP

[56] References Cited

U.S. PATENT DOCUMENTS

| | | | |
|---|---|---|---|
| 4,458,294 | 7/1984 | Womack | 361/321 |
| 4,527,185 | 7/1985 | Philofsky et al. | 357/70 |
| 4,734,819 | 3/1988 | Hernandez et al. | 361/306 |
| 4,903,113 | 2/1990 | Frankeny et al. | 357/70 |
| 4,989,117 | 1/1991 | Hernandez | 361/306 |

Primary Examiner—Donald A. Griffin
Attorney, Agent, or Firm—Gregory A. Bruns

[57] ABSTRACT

A decoupling apparatus for a microcircuit provides for a custom capacitor to be placed directly on the passivated upper surface of the integrated circuit or alternatively to be placed directly under the integrated circuit.

In another alternative, multiple standard chip capacitors are placed directly on the passivated upper surface and connected by wire bonds to metal bars also resting on the upper surface.

12 Claims, 4 Drawing Sheets

DIRECT MICROCIRCUIT DECOUPLING

BACKGROUND OF THE INVENTION

The invention disclosed herein relates generally to decoupling capacitors for use with integrated circuits.

In the past decoupling capacitors for integrated circuits have sometimes been separate devices mounted on a printed wiring board and wired across the power supply and return connection to the dual in-line or other type integrated circuit package.

Inductance is dependent on the loop area through which current flows and the magnetic flux through the loop. Voltage drop due to inductance is equal to $$L \frac{di}{dt}.$$

In the past approach of a separate capacitor on the circuit board the length of the path that the current must flow through from the capacitor to reach the chip contributes to the voltage drop due to $$L \frac{di}{dt}.$$

Another past approach has been to mount a decoupling capacitor on the chip package to reduce the lead length between the capacitor and the chip. While past methods provide adequate decoupling for many applications, there are other applications that require improved decoupling.

An example of such an application is the need for certain integrated circuit devices to be insensitive to being bombarded by ionizing radiation. A basic effect of the ionizing radiation is to generate electron-hole pairs in the semiconductor material. In an integrated circuit having a power supply voltage reference and a ground reference, the effect of being irradiated is to create a high current flow in the chip between the voltage reference and the ground reference. The further effect is for current flowing from the power supply to encounter inductance in the connecting leads from the power supply. The result is that the on-chip voltage essentially collapses.

A solution is to place a capacitor across the integrated circuit as close as possible to the integrated circuit so that the capacitor is charged to the chip power supply voltage. Then when a transient due to radiation or any cause occurs, the board capacitor is available to supply current instantaneously to the integrated circuit. Thus a need exists for a decoupling device that can be placed as close as possible to the integrated circuit.

SUMMARY OF THE INVENTION

The present invention solves these and other needs by providing a decoupling apparatus that is placed directly onto a passivated surface of an integrated circuit chip.

The present invention allows a custom capacitor to be located directly on the upper surface of the chip or alternatively for the capacitor to be located below the chip.

An alternative arrangement provides for the use of standard chip capacitors on the surface of the chip. Metal bars placed on the passivated chip surface make the chip power supply and power return or ground accessible. Wire bond connections extend from the metal bars to the capacitor terminals.

DESCRIPTION OF THE PREFERRED EMBODIMENT

Figure 1:
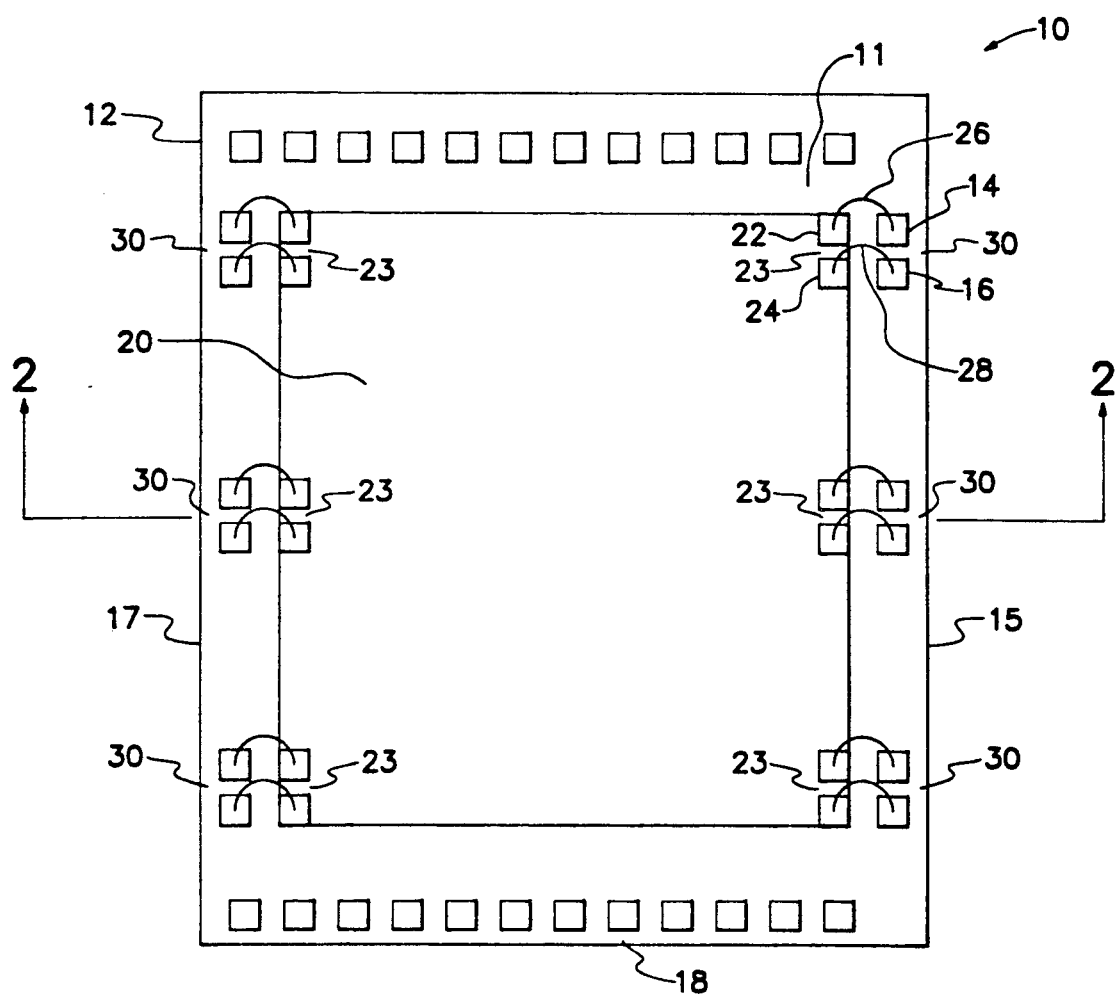
FIG. 1 is a plan view of a decoupling device in accordance with applicant's invention.

In FIGS. 1–6, reference numeral 10 identifies a decoupling apparatus in accordance with applicant's invention.

As shown in FIG. 1 microchip 12 has an upper surface 11 and lower surface 13. Power supply connection 14 and a power return connection 16 in the form of bonding pads are located on microchip surface 11. A combination of a power supply $V_{dd}$, and an adjacent power return $V_{ss}$, forms a $V_{dd}$-$V_{ss}$ pair. $V_{dd}$-$V_{ss}$ pairs are designated 30 and are shown in FIG. 1 located near or along side edges 15 and 17 of surface 11. Microchip 12 also includes bonding pads 18 for signal connections.

Figure 2:
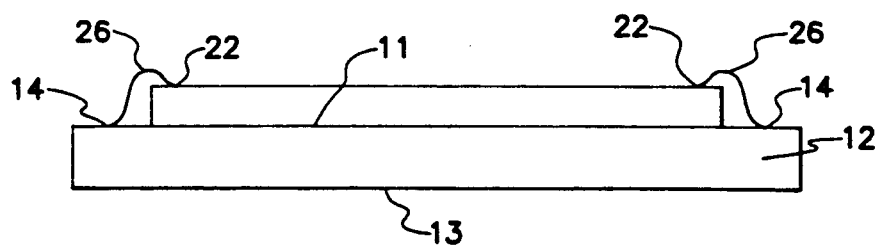
FIG. 2 is a side elevation view of the decoupling device of FIG. 1 according to section line 2—2.

As shown in FIGS. 1 and 2, custom capacitor 20 is located directly on passivated surface 11. Custom capacitor 20 may be physically attached to surface 11 by any of a variety of bonding agents. Instead of having only a terminal at each end, custom capacitor 20 is designed with pairs of terminals 23 which are made up of individual terminals 22 and 24 which are of the bonding pad type. Wire bond 26 connects power supply connection 14 to capacitor terminal 22 and wire bond 28 connects power return connection 28 to capacitor terminal 24. Capacitor terminals 22 and 24 form a pair of terminals 23.

Figure 7:
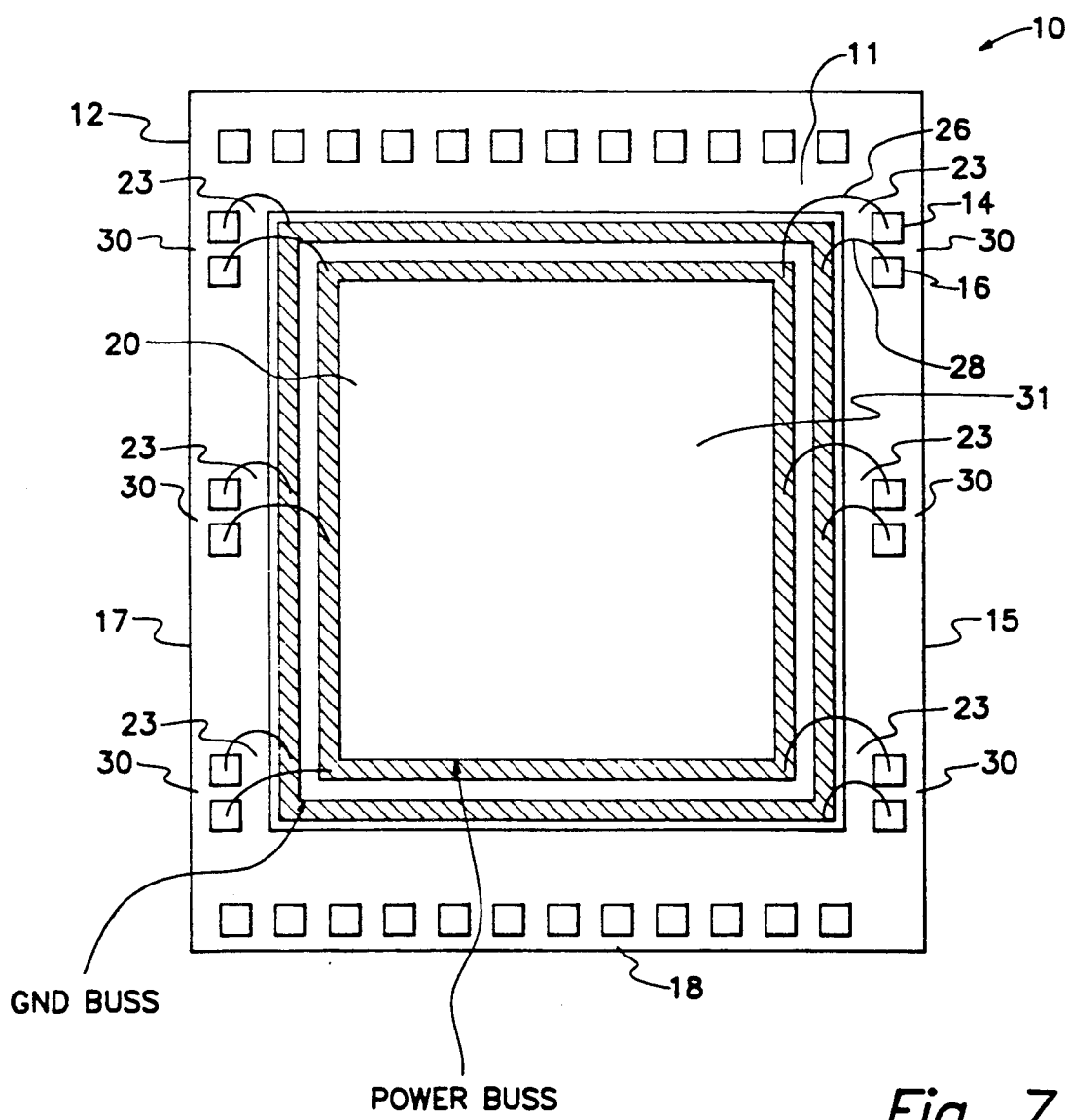
FIG. 7 is a variation of FIG. 1 showing an alternate capacitor design.

As shown in the drawings, custom capacitor 20 is designed with terminal paris 23 opposite $V_{dd}$-$V_{ss}$ pairs 30. As an alternate to the discrete pairs of terminals 22 and 24, continuous concentric power and ground rings on the upper surface of the custom capacitor 31 would allow a more universal capacitor design where the wire bond pairs 23 could be placed as required by the microchip 12 as shown in FIG. 7.

Figure 3:
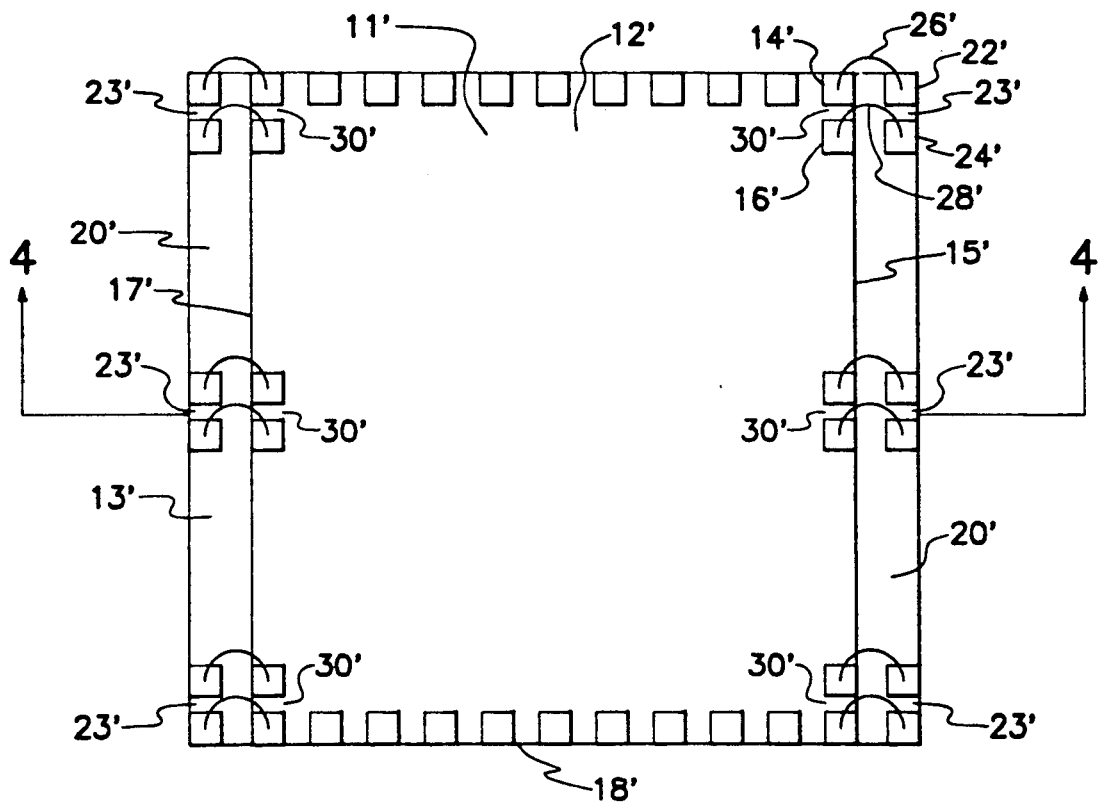
FIG. 3 is a plan view of an alternative design of the decoupling device.
Figure 4:
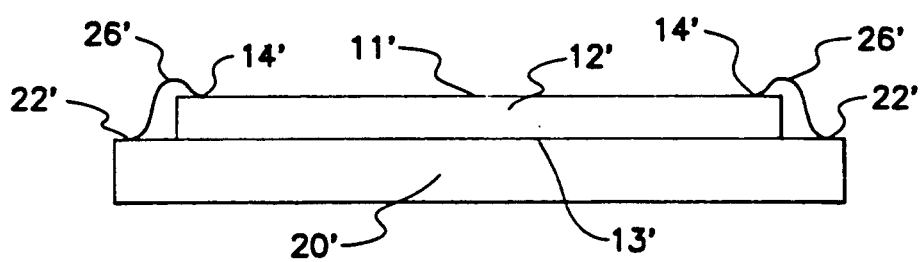
FIG. 4 is a side elevation view of the decoupling device of FIG. 3 according to section line 4—4.

In a first alternate design approach as shown in FIGS. 3 and 4, microchip 12' has an upper surface 11'; lower surface 13'; power supply connection 14' and power return connection 16'. Power supply connection 14' and power return connection 16' are in the form of bonding pads located on microchip upper surface 11'. A combination of a power supply 14' or $V_{dd}$ and a power return 16' or $V_{ss}$ form a $V_{dd}$-$V_{ss}$ pair which is designated 30'. $V_{dd}$-$V_{ss}$ paris are located near or along side edges 15' and 17' of surface 11'. Microchip 12' also includes bonding pads 18' for signal connections.

As shown in FIGS. 3 and 4 custom capacitor 20' is located below microchip 12' and is secured by a bonding agent directly against surface 13'. Custom capacitor 20' is designed with pairs of terminals 23' which are made up of individual terminals 22' and 24' which are of the bonding pad type.

Figure 5:
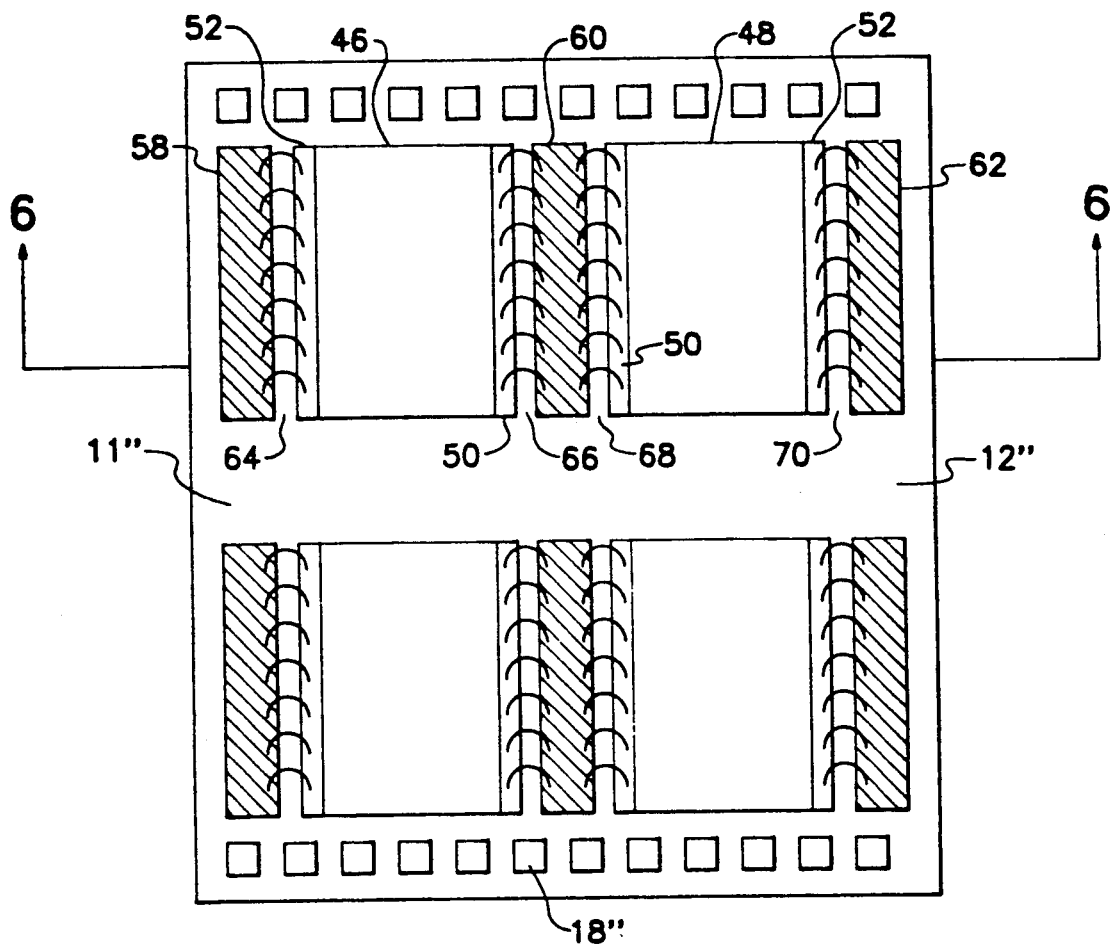
FIG. 5 is a plan view of a second alternative design of a decoupling device in accordance with applicant's invention.
Figure 6:
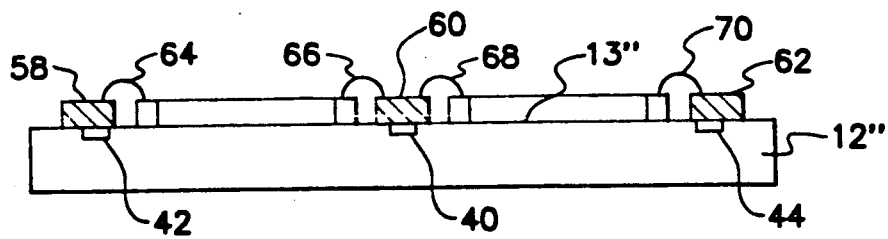
FIG. 6 is a side elevation view of the decoupling device of FIG. 5 according to section line 6—6.

A second alternative design approach which utilizes standard chip capacitors is shown in FIGS. 5 and 6 for decoupling apparatus 10.

In FIGS. 5 and 6 microchip 12" has its upper level metallization designed to bring the power supply connection and power return connections to surface 11" at locations which accommodate standard capacitor sizes. For example, in FIG. 6 power supply connections may be brought to 40 and power return connections brought to 42 and 44.

The second alternative design allows standard chip capacitors 46 and 48 to be used. For example, capacitor 46 is a standard chip capacitor which rests directly on surface 11" of microchip 12". Capacitor 46 has terminals 50 and 52 which preferably are gold plated.

Metal bars of which 58, 60 and 62 are typical are gold plated and are located directly on surface 11" and electrically connected to power supply 40 and power return 42 by solder bump connections at 42, 40 and 44. Electrical connections from metal bars 58 and 60 to capacitor 46 are made by wire bonds 64 and 66 respectively. Electrical connections from metal bars 60 and 62 to capacitor 48 are made by wire bonds 68 and 70 respectively.

Metal bars of which 60 is typical provide a large area contact with passivated surface 11". This area of contact provides for pressure distribution during the wire bonding operation. Therefore the cap attach wire bonds can be made over active circuitry without damage to the microcircuit and without chip area impact.

Now that the basic construction of the present invention has been set forth, certain features can be set forth and appreciated. The present invention provides for placing a capacitor on the chip or die rather than placing the die on the capacitor. An advantage of this feature is that the decoupling capacitor can be used as an option and not added until after package test. With this approach, capacitors are not wasted on die which fail the package testing. An additional advantage of placing the capacitor on the die occurs in multichip modules. Because the die size determines the spacing between die there is no need to increase die spacing to accommodate capacitors which are larger than the die.

The present invention provides for electrical connections from the die to the capacitor at multiple locations or $V_{dd}$-$V_{ss}$ pairs as shown at 30 in FIG. 1. The adjacent bond wires create magnetic fields which interact and partially cancel each other. This results in a significantly lower inductance and therefore lower $$L\frac{di}{dt}$$

voltage drop.

In addition the present invention allows the power supply and power return to connect at the same side of the custom capacitor. This reduces the inductance of the connection and also results in lower self-inductance than in conventional capacitors which have terminations on opposite ends.

Applicant's capacitor on die invention is especially advantages for multichip module designs. In one such design a ceramic module is used to mount multiple die, with routing between the die being within the ceramic module. Applicant's invention will allow a custom capacitor to be placed directly on the individual chip surfaces with no additional ceramic module surface or printed wiring board surface required for decoupling capacitor.

In accordance with the foregoing description, applicant has developed a simple microcircuit decoupling apparatus that may be easily incorporated into the design of integrated circuits when required by the application.

Although a specific embodiment of the applicant's mechanism is shown and described for illustrative purposes, a number of variations and modifications will be apparent to those of ordinary skill in the relevant arts. It is not intended that coverage be limited to the disclosed embodiment, but only by the terms of the following claims.

The embodiments of an invention in which an exclusive property of right is claimed are defined as follows:

1. A decoupling apparatus for a microcircuit having a planar upper surface, said microcircuit further having a power supply connection and a power return connection, said decoupling apparatus comprising:
   a planar capacitor having an end and an opposite end, said ends being electrical terminations to form first and second conductive terminations, said planar capacitor located directly on said planar upper surface;
   a first metal bar having a longitudinal axis and located on said planar upper surface with its longitudinal axis parallel to said capacitor end and electrically connected to said power supply connection;
   a second metal bar having a longitudinal axis and located on said planar upper surface with its longitudinal axis parallel to said capacitor opposite end and electrically connected to said power return connection means; and
   wire bonds extending from said first metal bar to said first conductive termination and from second metal bar to said second conductive termination.

2. The decoupling apparatus of claim 1 wherein said ends are gold plated.

3. A decoupling apparatus for a microchip having an upper planar first surface, said microchip further having a power supply connection means and a power return connection means, said decoupling apparatus comprising:
   a planar capacitor having an upper surface, a first termination means and a second termination means, said first and second termination means located at said upper surface, said planar capacitor located on said upper planar first surface;
   means for securing said planar capacitor means directly to said upper planar first surface with no intermediate insulating layer;
   means, independent of leadframe means, for electrically connecting said first termination means directly to said power supply connection means; and
   means, independent of leadframe means, for electrically connecting said second termination means directly to said power return connection means.

4. The decoupling apparatus of claim 3 wherein said first termination means comprises a power supply ring and said second termination comprises a power return ring, with said power supply ring and said power return ring being concentric.

5. The decoupling apparatus of claim 4 wherein said first termination means and said second termination means form a pair of terminations and wherein said planar capacitor has a periphery and a plurality of said pairs of terminations are located on said periphery.

6. The decoupling apparatus of claim 3 wherein said planar capacitor means is a plurality of individual capacitors.

7. The decoupling apparatus of claim 6 wherein said planar capacitor means comprises a plurality of individual capacitors with each individual capacitor having an end and an opposite end, said ends being gold plated to form said first and second terminations.

8. The decoupling apparatus of claim 6 wherein said means for electrically connecting comprises a first metallic bar having a longitudinal axis and located on said upper surface with its longitudinal axis parallel to said capacitor end and electrically connected to said power supply connection means, and a second metallic bar having a longitudinal axis and located on said upper surface with its longitudinal axis parallel to said capacitor opposite end and electrically connected to said power return connection means; and wire bonds extending from said first metallic bar to said first termination means and from said second metallic bar to said second termination means.

9. The decoupling apparatus of claim 8 wherein said metallic bars are gold plated.

10. A decoupling apparatus for a microchip having a planar first surface, said microchip further having a power supply connection means and a power return connection means;
   a planar capacitor having a second surface, said planar capacitor secured to said planar first surface;
   a first termination means to said planar capacitor comprising a closed first pattern formed on said second surface; and
   a second termination means to said capacitor comprising a closed second pattern formed on said second surface wherein said first sand second closed patterns are concentric;
   means for connecting said first termination means to said power supply connection means; and
   means for connecting said second termination means to said power return means.

11. The decoupling apparatus of claim 10 wherein said closed first pattern is a power supply ring and said closed second pattern is a power return ring.

12. The decoupling apparatus of claim 11 wherein said power supply connection means and said power return connection means are bonding pads and said means for connecting comprises a plurality of pairs of wire bond.

* * * * *